(12) United States Patent
Hasbun et al.

(10) Patent No.: US 11,055,000 B2
(45) Date of Patent: *Jul. 6, 2021

(54) APPARATUSES AND METHODS FOR COUNTER UPDATE OPERATIONS

(71) Applicant: Micron Technology, Inc., Boise, ID (US)

(72) Inventors: Robert N. Hasbun, San Jose, CA (US); Daniele Balluchi, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/905,030

(22) Filed: Jun. 18, 2020

(65) Prior Publication Data
US 2020/0319809 A1 Oct. 8, 2020

Related U.S. Application Data (63) Continuation of application No. 15/958,614, filed on Apr. 20, 2018.

(51) Int. Cl.
*G06F 3/06* (2006.01)
*G06F 13/42* (2006.01)
*G06F 13/16* (2006.01)

(52) U.S. Cl.
CPC .......... *G06F 3/0635* (2013.01); *G06F 3/0611* (2013.01); *G06F 3/0653* (2013.01);
(Continued)

(58) Field of Classification Search
CPC .............. G06F 13/1668; G06F 13/4282; G06F 2213/0026
See application file for complete search history.

(56) References Cited

U.S. PATENT DOCUMENTS 5,559,975 A ‡ 9/1996 Christie .............. G06F 9/30149
712/23
7,304,942 B1 ‡ 12/2007 Malladi .................. H04L 47/10
370/22
(Continued)

FOREIGN PATENT DOCUMENTS

KR 10-2015-0138933 A ‡ 12/2015
KR 10-2015-0138933 A 12/2015
(Continued)

OTHER PUBLICATIONS

Office Action from related Taiwan Patent Application No. 108112417, dated Jan. 22, 2020, 16 pages.‡

(Continued)

*Primary Examiner* — Tracy A Warren
(74) *Attorney, Agent, or Firm* — Brooks, Cameron & Huebsch, PLLC (57) ABSTRACT

The present disclosure includes apparatuses and methods for counter update operations. An example apparatus comprises a memory including a managed unit that includes a plurality of first groups of memory cells and a second group of memory cells, in which respective counters associated with the managed unit are stored on the second group of memory cells. The example apparatus further includes a controller. The controller includes a core configured to route a memory operation request received from a host and a datapath coupled to the core and the memory. The datapath may be configured to issue, responsive to a receipt of the memory operation request routed from the core, a plurality of commands associated with the routed memory operation request to the memory to perform corresponding memory operations on the plurality of first groups of memory cells. The respective counters may be updated independently of the plurality of commands.

20 Claims, 6 Drawing Sheets

(52) U.S. Cl.
CPC .......... *G06F 3/0659* (2013.01); *G06F 3/0679* (2013.01); *G06F 13/1668* (2013.01); *G06F 13/4282* (2013.01); *G06F 2213/0026* (2013.01)

(56) References Cited

U.S. PATENT DOCUMENTS

| | | | | |
|---|---|---|---|---|
| 7,391,721 | B1 ‡ | 6/2008 | Holbrook | H03K 21/00 370/22 |
| 10,019,360 | B2 ‡ | 7/2018 | Wang | G06F 12/084 |
| 2004/0047182 | A1 ‡ | 3/2004 | Cernea | G11C 11/5628 365/185.03 |
| 2007/0150644 | A1 ‡ | 6/2007 | Pinto | G11C 16/3495 711/10 |
| 2007/0245067 | A1 ‡ | 10/2007 | Yero | G06F 12/0246 711/10 |
| 2008/0285372 | A1 ‡ | 11/2008 | Sohn | G11C 8/10 365/23 |
| 2009/0193174 | A1 ‡ | 7/2009 | Reid | G06F 12/0246 711/100 |
| 2010/0165732 | A1 ‡ | 7/2010 | Lee | G11C 16/26 365/185.11 |
| 2013/0304982 | A1 ‡ | 11/2013 | Jung | G11C 11/40622 711/106 |
| 2015/0213877 | A1 ‡ | 7/2015 | Darel | G11C 11/40618 711/106 |
| 2017/0040053 | A1 ‡ | 2/2017 | Tanaka | H01L 27/11521 |
| 2017/0068479 | A1 ‡ | 3/2017 | Chin | G06F 3/0625 |
| 2017/0277634 | A1 ‡ | 9/2017 | Basu | G06F 12/0811 |
| 2019/0147941 | A1 ‡ | 5/2019 | Qin | G11C 11/419 711/102 |

FOREIGN PATENT DOCUMENTS

| | | | |
|---|---|---|---|
| TW | 201723859 | A ‡ | 7/2017 |
| TW | 201723859 | A | 7/2017 |

OTHER PUBLICATIONS

International Search Report and Written Opinion from related International Application No. PCT/US2019/024201, dated Jul. 10, 2019, 13 pages.‡

Singhal, A., Van der Wijngaart, R., and P. Barry, "Atomic Read Modify Write Primitives for I/O Devices," Intel Corporation White Paper, Aug. 2008. available: https://www.intel.com/content/dam/doc/white-paper/atomic-read-modify-write-primitives-i-o-devices-paper.pdf.‡

Singhal, et al., Atomic Read Modify Primitives for I/O Devices, Intel Corporation White Paper, Aug. 2008, available at: www.intel.com/content/dam/doc/white-paper/atomic-read-modify-write-primitives-i-o-devices-paper.pdf.

‡ imported from a related application

APPARATUSES AND METHODS FOR COUNTER UPDATE OPERATIONS

PRIORITY INFORMATION

This application is a Continuation of U.S. application Ser. No. 15/958,614, filed Apr. 20, 2018, the contents of which are incorporated herein by reference.

TECHNICAL FIELD

The present disclosure relates generally to semiconductor memory and methods, and more particularly, to apparatuses and methods for counter update operations.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read-only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

One of a number of states (e.g., resistance states) can be set for a resistance variable memory cell. For example, a single level cell (SLC) may be programmed (e.g., written) to one of two states (e.g., logic 1 or 0), which can depend on whether the cell is programmed to a resistance above or below a particular level. As an additional example, various resistance variable memory cells can be programmed to one of multiple different states corresponding to respective digit patterns (e.g., 10, 01, 00, 11, 111, 101, 100, 1010, 1111, 0101, 0001, etc.). Such cells may be referred to as multi state cells, multi-digit cells, and/or multilevel cells (MLCs).

The state of the memory cell can be determined (e.g., read), for example, by sensing current through the cell responsive to an applied interrogation voltage. The sensed current, which varies based on a voltage level of the cell, can indicate the state of the cell (e.g., the binary data stored by the cell). However, the voltage level of the cell may undesirably change due to various reasons, which can result in erroneous sensing of a memory cell.

DETAILED DESCRIPTION

The present disclosure includes apparatuses and methods for performing counter update operations. An example apparatus comprises a memory including a managed unit that includes a plurality of first groups of memory cells and a second group of memory cells, in which respective counters associated with the managed unit are stored on the second group of memory cells. The example apparatus further includes a controller. The controller includes a core configured to route a memory operation request received from a host and a datapath coupled to the core and the memory. The datapath may be configured to issue, responsive to a receipt of the memory operation request routed from the core, a plurality of commands associated with the routed memory operation request to the memory to perform corresponding memory operations on the plurality of first groups of memory cells. The respective counters may be updated independently of the plurality of commands.

A number of counters (e.g., read/write counters) may be utilized to determine when to "refresh" cells (e.g., setting the cells back to their target state). For example, a read signal and/or a write signal applied to the cells may undesirably alter (e.g., read/write disturbs) a state of a particular cell (e.g., to which the signals are applied) as well as those neighboring cells (e.g., cells adjacent to the particular cell), which results in an erroneous determination of a logical state of the cells. Accordingly, the number of counters may be utilized to identify a degree of influence of the signals on, for example, neighboring cells, and may determine when to refresh those neighboring cells to correctly sense a logical state of the cells.

Embodiments of the present disclosure provide various benefits such as reduced latencies associated with a memory device capable of updating counters (e.g., read/write counters) compared to previous approaches. For example, various previous approaches associated with updating counters include retrieving the counters from an array of memory cells, updating the retrieved counters at a different device than a device including the array of memory cells, and/or storing the retrieved counters back to the array of memory cells where the counters were previously stored. Such an approach can require constantly communicating information (e.g., transferring data) among the associated devices, which may result in undesired latencies associated with communicating the information and/or may be costly in terms of energy consumption by requiring a number of undesired sensing/programming of cells (e.g., which would further results in reduced data reliability and/or data integrity). In contrast, a number of embodiments of the present disclosure can provide counter update operations in a manner that reduces latencies associated with communicating information (e.g., read/write counters) and reducing energy consumption as compared to prior approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of" something (e.g., a number of memory cells) can refer to one or more of such things, whereas a "plurality of" is intended to refer to more than one of such things (e.g., more than one memory cell). Furthermore, the words "can" and "may" are used throughout this application in a permissive sense (e.g., having the potential to, being able to), not in a mandatory sense (e.g., required to).

Figure 3A:
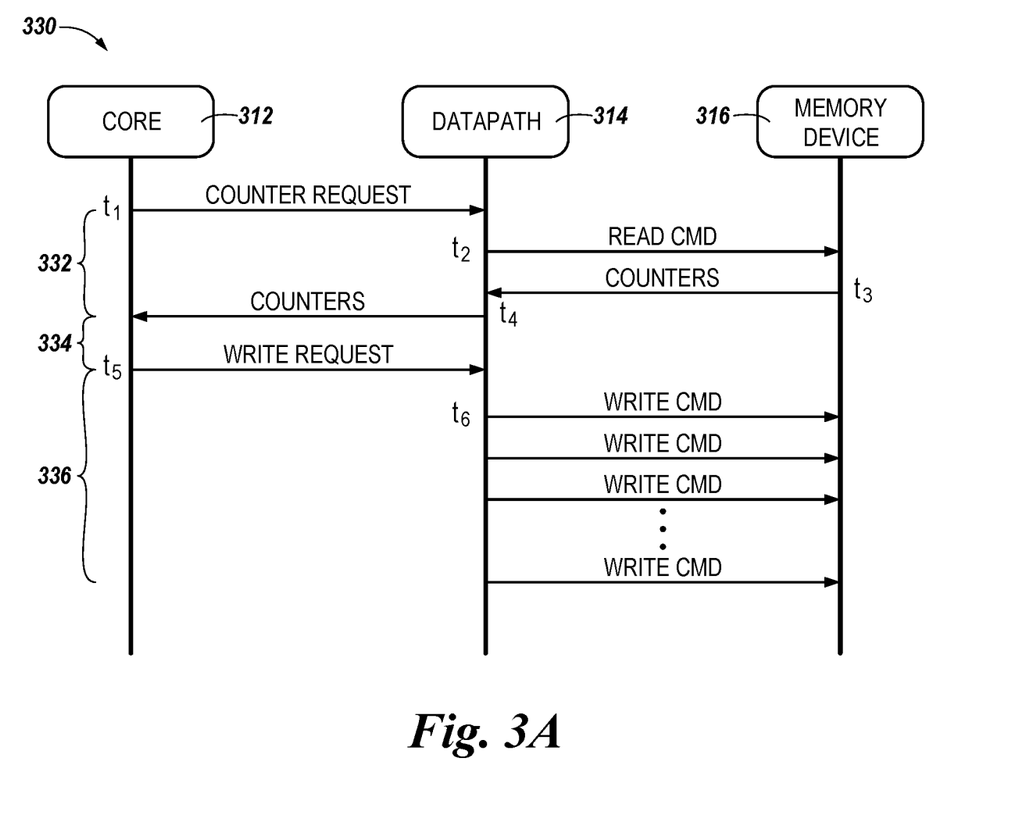
FIG. 3A illustrates a timing diagram associated with updating counters associated with a write operation.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 310 in FIG. 3.

Ordinal numbers such as first and second are used herein to assist in correlating and/or distinguishing between similar and/or selectably coupled components (e.g., groups of memory cells, materials, etc.) and are not used to indicate a particular ordering and/or relationship between the components, unless the context clearly dictates otherwise (e.g., by using terms such as adjacent, etc.).

Figure 1:
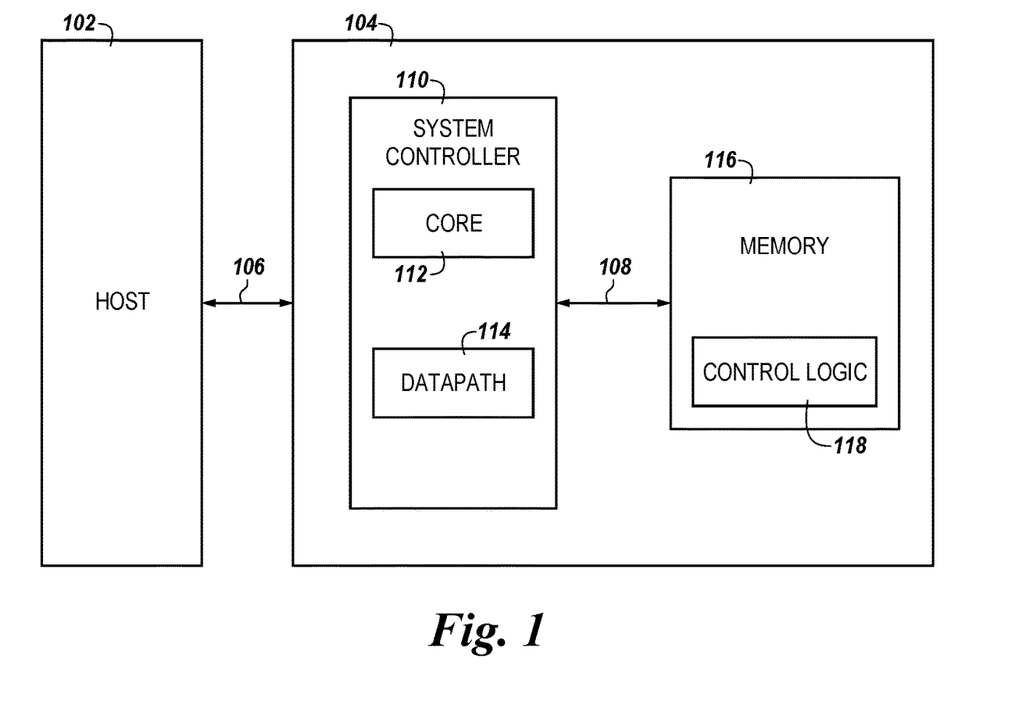
FIG. 1 is a block diagram of an apparatus in the form of a computing system including a memory system capable of performing counter update operations in accordance with a number of embodiments of the present disclosure.

FIG. 1 is a block diagram of an apparatus in the form of a computing system 100 including a memory system 104 capable of performing counter update operations in accordance with a number of embodiments of the present disclosure. As used herein, a memory system 104, a system controller 110, or a memory device 116 might also be separately considered an "apparatus." The memory system 104 can be a solid state drive (SSD), for example, and can include a host interface 106, a system controller 110, and a memory device 116, which can serve as a memory for system 104.

The system controller 110 can be coupled to the host 102 via host interface 106 and to the memory device 116 via memory interface 108, and can be used to transfer data between the memory system 104 and a host 102. The host interface 106 can be in the form of a standardized interface. For example when the memory system 104 is used for data storage in a computing system 100, the host interface 106 can be a serial advanced technology attachment (SATA), peripheral component interconnect express (PCIe), or a universal serial bus (USB), among other connectors and interfaces. In general, the memory system 104 and the host 102 that are coupled to each other via the host interface 106 may each have a compatible receptor for passing control, address, data, and other signals via the host interface 106. Similarly, the system controller 110 and the memory device 116 may each have a receptor compatible with the memory interface 108. The memory interface 108 may support various standards and/or comply with various interface types (e.g., DDR, ONFI, etc.).

Host 102 can include a system motherboard and/or backplane and can include a number of memory access devices (e.g., a number of processors). Host 102 can also be a memory controller, such as where memory system 104 is a memory device (e.g., a memory device having an on-die controller). As an example, assuming that the computing system 100 is a cellular phone (e.g., smartphone), the host 102 may be a system on a chip (SoC) and the memory system 104 can be an embedded Multi-Media Controller (eMMC) and/or Universal Flash Storage (UFS).

The system controller 110 can communicate with the memory device 116 (which in some embodiments can be a number of memory arrays on a single die and/or a number of dies) to control data read, write, and erase operations, among other operations. The system controller 110 can be coupled to the memory interface 108 coupling the system controller 110 to the memory device 116. The system controller 110 can include, for example, a number of components in the form of hardware and/or firmware (e.g., one or more integrated circuits) and/or software for controlling access to the memory device 116 and/or for facilitating data transfer between the host 102 and memory device 116.

In some embodiments, the system controller 110 may be a non-volatile memory express (NVMe) controller. For example, the system controller 110 may be configured to operate in accordance with a logical device interface specification (e.g., protocol) such as the NVMe specification or a non-volatile memory host controller interface specification. Accordingly, in some embodiments, the system controller 110 may be configured to process commands according to the NVMe protocol.

The system controller 110 can include a core component 112 and a datapath component 114. The core component 112 can be configured to perform various functions such as receiving a memory operation request (e.g., request to perform operations on the memory device 116) from the host 102 and route the request to a datapath component 114. The datapath component 114 can be configured to generate, responsive to a receipt of the routed request, commands associated with the routed request and issue the commands to the memory device 116.

In some embodiments, the datapath component 114 can serve as an arbiter component, which can be configured to perform various functions such as coordinating commands performed on memory device 116. In some embodiments, the datapath component 114 can serve as a sequencer component, which can be configured to perform various functions such as sequencing commands to be issued to the memory device 116 such that operations corresponding to the commands may be performed within the memory device 116 as sequenced by the datapath component 114.

The memory device 116 can include a number of memory arrays (not shown) and a control logic 118 (e.g., memory controller). The control logic 118 can be located internal to the memory device 116 and can receive commands (e.g., write commands, read commands, refresh commands, etc.) from the system controller 110 via the memory interface 108. As described further herein, the control logic 118 can be configured to manage (e.g., update) counters stored in the memory device 116 independently of the host 102 (e.g., without assistance from external controller such as the host 102). Stated differently, the control logic 118 can be configured to perform the counter update operation despite that the system controller 110 does not cause the control logic 118 to perform the counter update operation. Accordingly, the control logic 118 can be configured to update the counters without transferring the counters back to the system controller 110.

In some embodiments, the system controller 110 may not cause the control logic 118 to perform the counter update operation unless requested by the control logic 118. For example, the control logic 118 may perform the counter update operations independently of the system controller 110 (e.g., absent a direction issued from the system controller 110) by, for example, incrementing/decrementing a respective counter value until a threshold is reached. When the threshold is reached, the control logic 118 may request a direction from the system controller 110. In this event, responsive to the request from the control logic 118, the system controller 110 may issue a direction associated with what to do when the threshold is reached (e.g., increment, decrement, and/or reset). As such, in some embodiments, the system controller 110 may be offloaded from burdens of performing counter update operations by allocating a portion of the burdens to the control logic 118.

In a number of embodiments, updating counters (e.g., by the control logic 118) may include incrementing values of the counters, for example, until a threshold value is reached, decrementing/resetting values of the counters, for example, when a state of memory cells are refreshed, and/or alerting (e.g., interrupt signal) the host 102 and/or the system controller 110 when any one of the counters reaches a threshold value. In some embodiments, a read counter may be incremented each time corresponding memory cells are read. Similarly, a write counter may be incremented each time corresponding memory cells are programmed (e.g., written). The terms "program" and "write" are used interchangeably herein and may have the same meaning, as appropriate to the context.

In some embodiments, counters (e.g., at least a portion of the counters) may have a plurality of thresholds. For example, a particular counter (e.g., read and/or write) may include two different thresholds, and each of the two different thresholds may be utilized to further define what course of action, for example, the memory device 116 can take when each threshold is reached. As an example, the memory device 116 may be configured to send an alert to the host when one threshold (e.g., lower) is met for the particular counter and further configured to reset (e.g., saturate) the particular counter when another threshold (e.g., higher) is met. The terms "reset" and "saturate" are used interchangeably herein and may have the same meaning, as appropriate to the context.

In some embodiments, resetting values may include adjusting values to an initial value (e.g., 0 and/or a predetermined value such as X). For example, when a particular value reaches a threshold, the particular value may be adjusted (e.g., reset) to the initial value such that the particular value may again be incremented/decremented without exceeding the threshold value. Values may be reset each the threshold value is met (e.g., reinitialization).

In some embodiments, different types of counters may be employed for the computing system 100. The different types of counters may include, for example, a read counter that can be particularly utilizable for a cache memory such that it may be reset more frequently than it would have been had the read counter utilized for main memory (e.g., memory device 116). The different types of counters may include, for example, two different write counters such that one of the two different write counters can be utilized for memory operations (e.g., read/write operations) and another one of the two different write counters can be utilized for wear leveling operations.

In a number of embodiments, the memory array(s) of memory device 116 can comprise non-volatile memory cells. For example, the memory cells of the memory array may be resistance variable memory cells such as PCRAM and/or RRAM. As an example, the memory cells can be phase change memory (PCM) cells, which can be chalcogenide-based memory cells including a single chalcogenide material serving as both a storage elements and a switch elements for the cells and/or a stack of materials with a first chalcogenide material serving as a switch element and a second chalcogenide serving as a storage element for the cells. However, embodiments are not so limited. For example, memory arrays of the memory device 116 may comprise NAND flash memory cells and/or NOR flash memory cells, among others.

Memory cells (e.g., resistance variable memory cells) may be rewritable. For example, a particular data pattern can be programmed to a group of resistance variable memory cells without necessarily erasing data previously stored in the group.

In operation, data can be written to and/or read from memory device 116 as a block of data, for example. As such, a block of data can be referred to as a data transfer size of the memory system 104. Data can be sent to/from a host (e.g., host 102) in data segments referred to as sectors (e.g., host sectors). As such, a sector of data can be referred to as a data transfer size of the host. In a number of embodiments, the memory device 116 can store managed units in respective blocks of memory cells (e.g., resistance variable memory cells). As used herein, a managed unit may be referred to as a number of memory cells that are programmed and/or read together or as a functional group.

Figure 2:
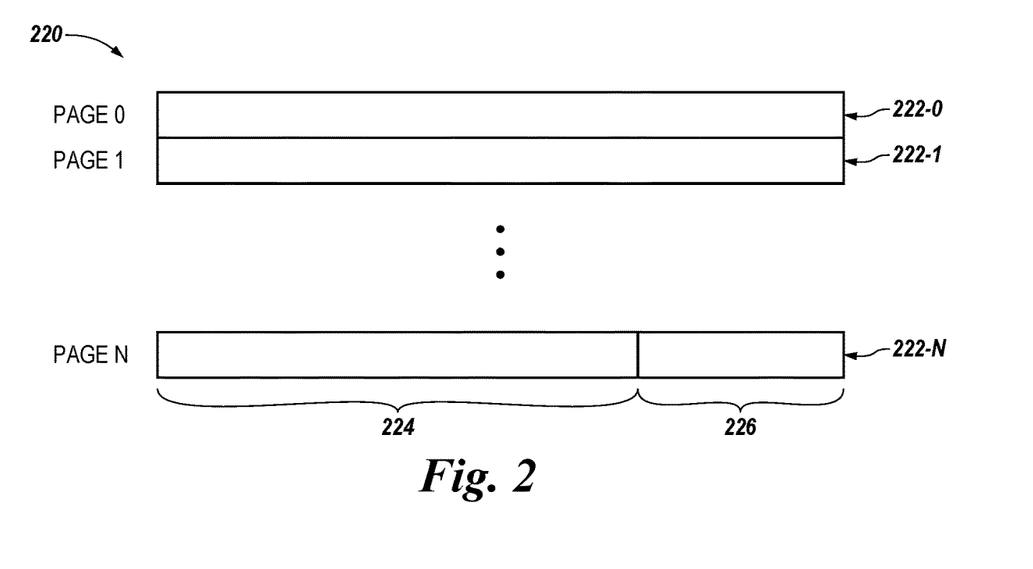
FIG. 2 illustrates a diagram of an example physical block having a number of physical pages in accordance with a number of embodiments of the present disclosure.

A managed unit may correspond to a logical block size (e.g., a data transfer size of a host such as host 102) and/or a data management size of a memory system (e.g., memory system 104), which can be, for example, 4 KB. As an example, a managed unit can be mapped (e.g., via system controller 110) to a physical block of memory cells. However, embodiments are not so limited. For example, a managed unit may correspond to more than a logical block size when a group of memory cells storing user data and overhead data (e.g., data informative of other data stored within the group of memory cells) corresponds to more than a logical block size. As an example, the overhead data may include data such as metadata, error correction code (ECC) data, logical block addresses (LBA) data as well as counters (e.g., read/write counters) associated with memory operations performed on a managed unit (e.g., physical block 220).

In a number of embodiments, a managed unit may include different types of groups of memory cells. For example, the managed unit may include a plurality of first groups of memory cells and a second group of memory cells, in which counters associated with the managed unit may be stored on the second group of memory cells. As described herein, a "group of memory cells" may correspond to a page of memory cells.

FIG. 2 illustrates a diagram of an example physical block 220 having a number of physical pages 222-0 (PAGE 0), 222-1 (PAGE 1), . . . , 222-N (PAGE N) in accordance with a number of embodiments of the present disclosure. In a number of embodiments, the example physical block 220 may be a managed unit as described in connection with FIG. 1. For example, a physical block of cells can refer to a number of memory cells that are programmed and/or read together or as a functional group.

The block 220 may include a number of pages 222-0 (PAGE 0), 222-1 (PAGE 1), . . . , 222-N(PAGE N) (e.g., collectively referred to as pages 222). As an example, the number of physical pages 222 may be 128 pages with each page corresponding to 32 bytes page size. As such, the block 220 also can correspond to 4 KB bytes block size. However, embodiments are not so limited. For example, the number of physical pages 222 may be 516 pages, 1024 pages, etc. and a block size of the block 220 can vary based on a page size of each page (e.g., pages 220) and a number of pages the block 220 includes.

In some embodiments, physical pages 222-0, . . . , 222-(N−1) may be utilized to store user data, and a physical page 222-N may be utilized to store overhead data, such as metadata, error correction code (ECC) data, logical block addresses (LBA) data as well as counters (e.g., read/write counters) associated with memory operations performed on a managed unit (e.g., physical block 220). In some embodiments, more than one physical page (e.g., physical page 222-N) may be allocated to store the overhead data.

The physical page 222-N is illustrated in greater detail in FIG. 2. As illustrated in FIG. 2, the physical page 222-N includes a first portion 224 and a second portion 226 that may be utilized to store different types of data. In some embodiments, data stored on the first portion 224 may be metadata including integrity data such as error data (e.g., error detecting and/or correcting code data). In some embodiments, data stored on the first portion 224 may be information related to a particular physical block (e.g., logical block address corresponding to the particular physical block) which may be used by the system controller 110.

The second portion 226 of the physical page 222-N may include counters such as a read counter and/or a write counter. As used herein, a read counter may be referred to as a value indicating a quantity of read operations performed on a managed unit (e.g., physical block 220), for example, relative to a quantity of read operations performed on managed units. As used herein, a write counter may be referred to as a value indicating a quantity of write operations performed on a managed unit (e.g., physical block 220), for example, relative to a quantity of write operations performed on managed units.

As an example, in which a physical page 222 corresponds to a page size of 32 bytes, the first portion 224 that stores the user data can correspond to 30 bytes, and the second portion 226 that stores the counters (e.g., read/write counters) can correspond to 2 bytes (e.g., 1 byte for each of the counters). However, embodiments are not so limited. For example, size of counters may vary such that, in some embodiments, read and write counters may be 8-bit each, and/or, in some embodiments, a size of a read counter may correspond to 16 bits while a size of a write counter may correspond to 32 bits.

Having a relatively small size for a managed unit (e.g., physical block 220 corresponding to a block size of 4 KB) may provide benefits such as enabling the control logic 118 to manage counters stored in the managed unit, as compared to those approaches having a block corresponding to a block size of 512 KB, 1.024 MB, etc. For example, the control logic 118 may be restricted in terms of a circuit design due to a size/design of the memory device 116 such that the circuit design of the control logic 118, in some embodiments, may need to be simplified as compared to the system controller 110. As such, the control logic 118 with the simplified circuit design may not be capable of managing counters for those blocks corresponding to a relatively large block size such as 512 KB, 1.024 MB, etc. In contrast, embodiments of the present disclosure reduce a size of each managed unit managed by the control unit 118, which provides benefits of enabling counter management independently of the system controller 110.

FIG. 3A illustrates a timing diagram 330 associated with updating counters associated with a write operation 336. The counters may be updated (e.g., managed) by a system controller 310, which can be a controller such as the system controller 110 that includes the core component 112 (e.g., analogous to a core component 312) and the datapath component 114 (e.g., analogous to a datapath component 314) as described in connection with FIG. 1. In this example, the write operation 336 is an operation requested by a host (e.g., host 102) to be performed on a memory device 316. A read operation 332 is an operation performed to obtain (e.g., retrieve) counters to be updated via a counter update operation 334.

In this example, at a time $t_1$, the core 312 sends a counter request to the datapath 314. For example, the counter request may be a request for retrieving (e.g., reading) counters (e.g., write counters) associated with a physical block address (PBA) to which the write operation 336 is to be performed. The datapath 314 generates a command (e.g., "read cmd") corresponding to the received counter request, and sends, at time $t_2$, the generated command to the memory device 316. At time $t_3$, the counters retrieved from the memory device 316 are received at the datapath 314, which routes, at a time $t_4$, the retrieved counters to the core 312. As such, at some point subsequent to $t_4$, the counters may be updated by the core 312 via a counter update operation 334. The updated counters may be stored back to the memory device 316 via the write operation 336. For example, at a time $t_5$, the core 312 sends a write request (e.g., to perform the write operation 336) to the datapath 314, which generates write commands (e.g., "write cmd") corresponding to the write request and sends, starting from a time $t_6$, the generated write commands to the memory device 316. As an example, when the write operation 336 is to be performed on one of the managed units (e.g., block 220) of the memory device 316, each of the generated write commands may be directed to a corresponding page of the managed unit.

As illustrated in FIG. 3A, when the counters associated with the write operation 336 are managed (e.g., updated) by the system controller 310, the system controller 310 may need to obtain information associated with the counters prior to writing back the updated counters to the memory device 316. Accordingly, the read operation 332 that is separate from the write operation 336 needs to be performed to obtain the counters.

Figure 3B:
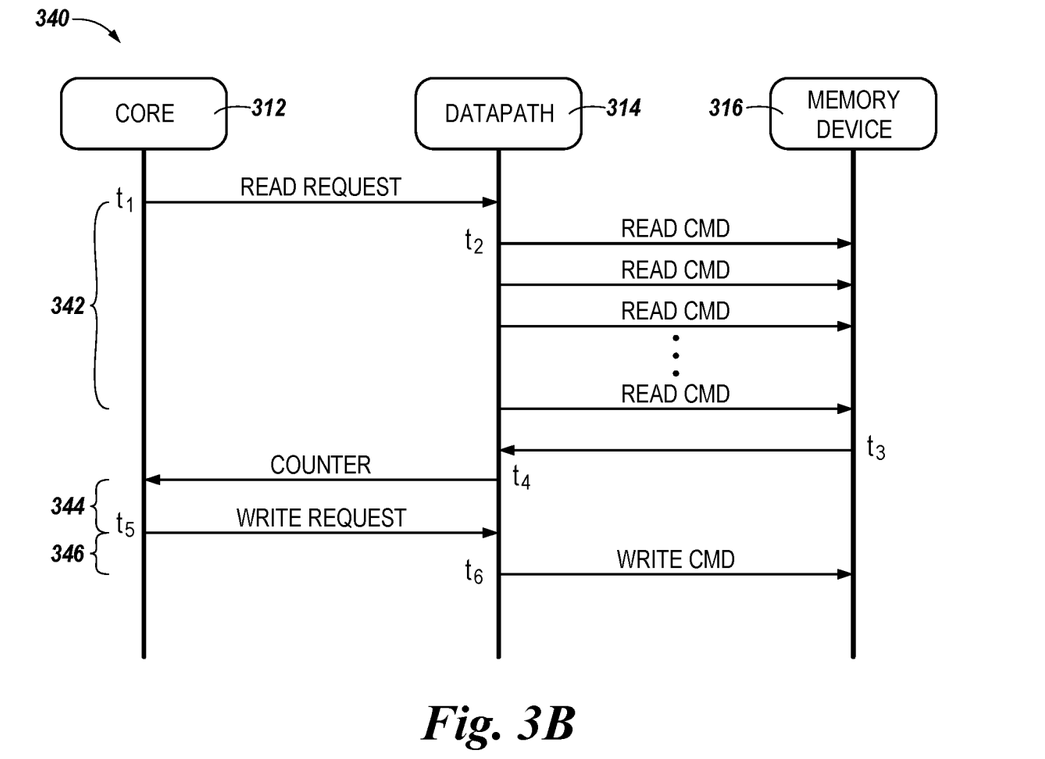
FIG. 3B illustrates a timing diagram associated with updating counters associated with a read operation.

FIG. 3B illustrates a timing diagram 340 associated with updating counters associated with a read operation 342. The counters may be updated (e.g., managed) by a system controller 310, which can be a controller such as the system controller 110 that includes the core component 112 (e.g., analogous to a core component 312) and the datapath component 114 (e.g., analogous to a datapath component 314) as described in FIG. 1. In this example, the read operation 342 is an operation requested by a host (e.g., host 102) to be performed on a memory device 316. A write operation 346 is an operation performed to obtain (e.g., retrieve) counters to be updated via a counter update operation 344.

In this example, at a time $t_1$, the core 312 sends a request (e.g., read request) to perform the read operation 342 on the memory device 316 (e.g., a block of the memory device 316). The datapath 314 generates a command (e.g., read commands as illustrated in FIG. 3B) corresponding to the request, and sends, starting from a time $t_2$, the generated commands to the memory device 316.

Data requested to be read (e.g., as specified by read commands) may be retrieved (e.g., returned) to the datapath 314 at a time $t_3$. Datapath 314 routes, at a time $t_4$, the received data to the core 312 such that the core 312 further returns the retrieved data to the host (e.g., host 102). The retrieved data (e.g., retrieved to the host) may include counters (e.g., read counters associated with a physical block address to which the write operation 346 is to be performed). As such, upon receiving the counters (e.g., at the system controller 310), the counters may be updated by the system controller 310 at some time between $t_4$ (e.g., subsequent to receiving the counters at the core 312) and $t_5$ (e.g., prior to sending a request to write the updated counters back to the memory device 316).

To write (e.g., store) the updated counters back to the memory device 316, another operation (e.g., write operation 346) that is separate from the read operation 342 needs to be performed. For example, at a time $t_5$, the core 312 sends a counter request (e.g., to write the updated counters back to the memory device 316) to the datapath 314, which generates a write command (e.g., "write cmd") corresponding to the counter request, and sends, at a time $t_6$, the generated write command to a particular location (e.g., where the counters were previously retrieved from) of the memory device 316.

When counters are managed (e.g., updated) by a controller, such as the system controller 110, updating counters associated with a write operation (e.g., as illustrated in FIG. 3A) and a read operation (e.g., as illustrated in FIG. 3B) may require an operation that is separate from the associated write and read operations 336, 342. For example, counters associated with the write operation 336 of FIG. 3A may not be updated without a separate read operation 332 because the system controller 310 needs to identify a value corresponding to the counters prior to updating and writing back to the memory device 316. Similarly, counters associated with the read operation 342 of FIG. 3B may not be updated without a separate write operation 346 because, although the counters may be read by the read operation 342, the updated counters need to be written back to the memory device 316, which may not be performed by the read operation 342.

Figure 3C:
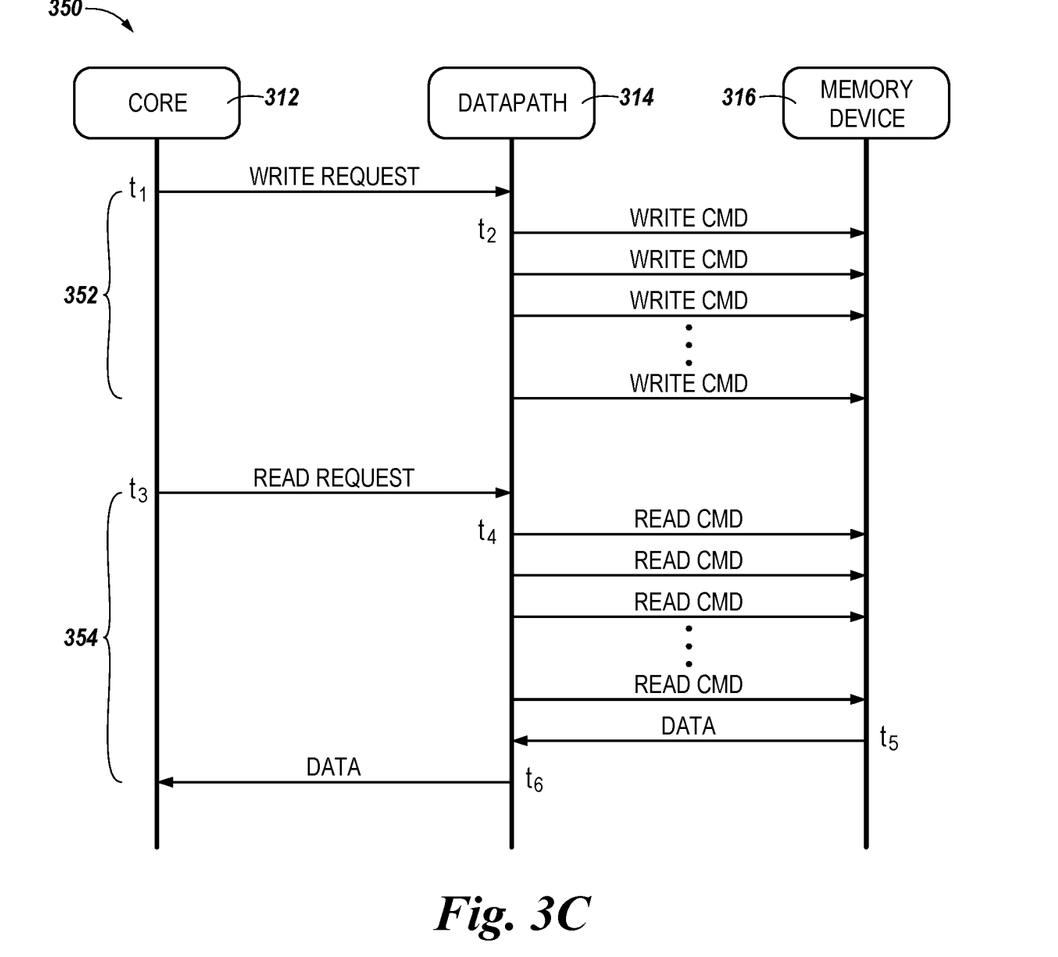
FIG. 3C illustrates a timing diagram associated with performing a counter update operation in accordance with a number of embodiments of the present disclosure.

FIG. 3C illustrates a timing diagram 350 associated with performing a counter update operation in accordance with a number of embodiments of the present disclosure. A write operation 352 and a read operation 354 illustrated in FIG. 3C may be operations requested by a host (e.g., host 102) The counters may be updated (e.g., managed) by, for example, a control logic (e.g., control logic 118 of FIG. 1) of a memory device 316.

In this example, at a time $t_1$, the core 312 sends a request to perform a write operation 352 on the memory device 316 (e.g., a block of the memory device 316). For example, the request to perform the write operation may be a request received from a host (e.g., host 102). The datapath 314, responsive to receiving the request from the core 312, generates a command (e.g., "write cmd") corresponding to the request, and sends, starting from a time $t_2$, the generated commands to the memory device 316. As an example, when the write operation 352 is to be performed on one of managed units (e.g., block 220) of the memory device 316, each of the generated write commands may be directed to a corresponding page of the managed unit.

In this example, at a time $t_3$, the core 312 sends a request to perform a read operation on the memory device 316 (e.g., a block of the memory device 316). For example, the request to perform the read operation 354 may be a request received from a host (e.g., host 102). The datapath 314, responsive to receiving the request from the core 312, generates a command (e.g., "read cmd") corresponding to the request, and sends, starting from a time $t_4$, the generated commands to the memory device 316. As an example, when the read operation 354 is to be performed on one of managed units (e.g., block 220) of the memory device 316, each of the generated read commands may be directed to a corresponding page of the managed unit. Data requested to be read (e.g., as specified by read commands) may be retrieved (e.g., returned) to the datapath 314 at a time $t_5$. Datapath 314 routes, at a time $t_6$, the received data to the core 312 such that the core 312 further returns the retrieved data to the host (e.g., host 102). In a number of embodiments, the data retrieved at a time $t_6$ from the memory device 316 may be free of (e.g., may not include) information associated with counters (e.g., counter values).

In a number of embodiments, commands generated by the datapath 314 and issued to the memory device 316 may be free of instructions to cause the memory device 316 (e.g., control logic 118) to update the counters. Stated differently, commands issued starting from a time $t_2$ and $t_4$ may include instructions to cause the control logic 118 to perform corresponding memory operations (e.g., read/write operations 352, 354) while the same commands may be free of (e.g., may not include) instructions to cause the control logic 118 to perform the counter update operations. Accordingly, the control logic 118 can be configured to perform a counter update operation independently of the system controller 110 and/or the host 102 while being configured to perform memory operations (e.g., requested by the host 102) dependently of the received commands.

Further, the counter update operation performed as illustrated in FIG. 3C is embedded within the write operation 352 and/or the read operation 354 in that it can be performed without a separate read operation (e.g., such as the read operation 332 for the write operation 336) and/or a separate write operation (e.g., such as the write operation 344 for the read operation 342). Also, unlike the counter update operation described in FIGS. 3A and 3B, which is performed responsive to a request from the core 312 that is separate from a request to perform a read operation 336 and/or a write operation 342, the counter operation embedded within corresponding memory operations may be performed responsive to an individual request that would also trigger performing the corresponding memory operations.

Figure 4:
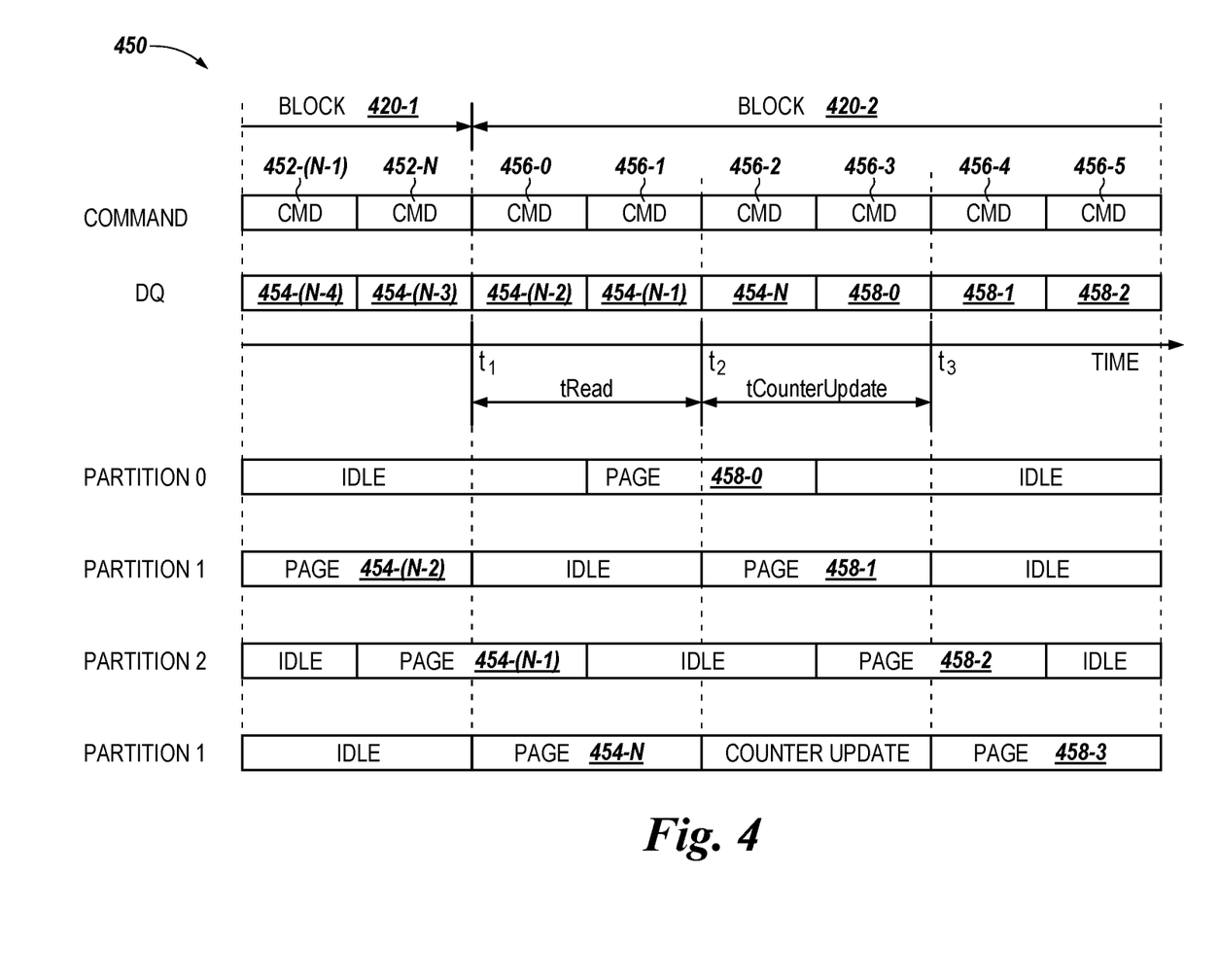
FIG. 4 illustrates a diagram associated with performing an example counter operation during a read operation in accordance with a number of embodiments of the present disclosure.

FIG. 4 illustrates a diagram 450 associated with performing a counter update operation during a read operation in accordance with a number of embodiments of the present disclosure. In this example illustrated in FIG. 4, the read operation may be an operation requested by a host (e.g., host 102) to be performed on blocks 420 (e.g., block 220). For example, a request to perform the read operation may be received at a system controller (e.g., system controller 110), which generates corresponding commands (e.g., by the datapath component 114) and sends the corresponding commands to a control logic (e.g., control logic 118).

As illustrated in FIG. 4, two different blocks 420-1 and 420-2 (e.g., collectively referred to as blocks 420) are shown in FIG. 4. Each of the blocks may be a managed unit and partitioned into a number of address spaces such that each of the number of address spaces may be controlled independently of others. For example, each partitioned address space of the blocks may include a portion of a number of pages (e.g., of each of the blocks) such that a number of operations may be simultaneously performed among pages of the same block. For example, the control logic 118 may initiate a read operation (e.g., along with a counter update operation) corresponding to a command 452-N while a read operation corresponding to a command 452-(N−1) is being performed. As an example, pages 454-(N−2), 454-(N−1), 454-N (e.g., of the block 420-1) may be assigned to a partition 1, 2, and 3, respectively, and pages 458-0, 458-1, 458-2, and 458-3 may be assigned to a partition 0, 1, 2, and 3, respectively.

The block 420-1 may include a number of pages (e.g., N+1 pages) including a page 452-(N−1) and a page 452-N. For example, the page 452-(N−1) (e.g., one of a plurality of first groups of memory cells) may comprise user data, which can be read (e.g., retrieved to a host 102) via a read command 452-(N−1). For example, the page 452-N (e.g., a second group of memory cells) may comprise overhead data along with counters associated with the block 420-1. Accordingly, a counter update operation may be performed on the page 452-N.

In this example illustrated in FIG. 4, read commands 452 including commands 452-(N−1) and 452-N may be sequentially received prior to a time $t_1$. Accordingly, read operations on the pages 454 including pages 454-(N−2), 454-(N−1), and 454-N may be sequentially initiated in response to the receipt of the read commands 452.

The command 452-(N−1) directed to a page 454-(N−1) is received (e.g., at the control logic 118) at some time prior to a time $t_1$ as well as prior to a command 452-N. As such, in response to a determination that the page 454-(N−1) comprises the user data, the control logic 118 can perform a read operation on the page 454-(N−1) by retrieving the user data back to the system controller 110, which can further return the retrieved user data back to the host 102.

The command 452-N directed to a page 454-N is received (e.g., at the control logic 118) at a time $t_1$. As such, in response to a determination that the page 454-N comprises the counters, the control logic 118 can update (e.g., perform a counter update operation) the counters (e.g., read counters) in addition to performing the read operation as requested by the host 102 and instructed by the command 452-N. For example, data stored on the page 454-N can be read from a $t_1$ to $t_2$ (e.g., "tRead") and the counters may be updated from $t_2$ to $t_3$ (e.g., "tCounterUpdate"). The retrieved data (e.g., denoted as "454-N") may be sent back to the system controller 110 via a data bus such as a DQ bus.

In a number of embodiments, the counters may be updated without being transferred back to the system controller 110. Accordingly, in this example, the counters stored on the page 454-N may be simultaneously updated while the overhead data (e.g., metadata) and the counters retrieved from the page 454-N may be sent back to the system controller 110. For example, the metadata retrieved from the page 454-N may be sent, at a time $t_2$, back to the system controller 110, and the counters may be updated also at a time $t_2$. Therefore, latencies associated with transferring the counters between the memory device 116 and the system controller 110 may be eliminated in updating the counters.

In some embodiments, the counters may be buffered to be updated at a later time (e.g., subsequent to a time $t_2$). Instead of being updated at $t_2$, the counters may be, for example, buffered (e., from being updated) until an internal resource is readily available for updating the counters such that other operations (e.g., read/write operations) are not adversely affected by latencies associated with updating the counters.

In this example illustrated in FIG. 4, write commands 456 including commands 456-0, 456-1, 456-2, and 456-3 may be sequentially received subsequent to a time $t_1$, and write operations on the pages 458 including pages 458-0, 458-1, 458-2, and 458-3 may be sequentially initiated in response to the receipt of the write commands 566. While the counters are being updated, another operation (e.g., read operation) may be initiated on another block 420-2. For example, those pages 458-0, 458-2, and 458-3 that are assigned to a different partition (e.g., address space) than the page 454-N may be read simultaneously with the counter update operation being performed on the page 454-N.

In some embodiments, the data stored on the page 454-N may not be retrieved to the system controller 110. In this example, rather than providing the data stored on the page 454-N to the system controller 110, the control logic 118 may provide, at a time $t_2$, data stored on and retrieved from the page 458-1 via a data bus. As such, latencies associated with transferring the data stored on the page 454-N (e.g., including the counters) may be eliminated in performing a number of memory operations on the memory device 116 (e.g., including the block 420-1 and 420-2).

Figure 5:
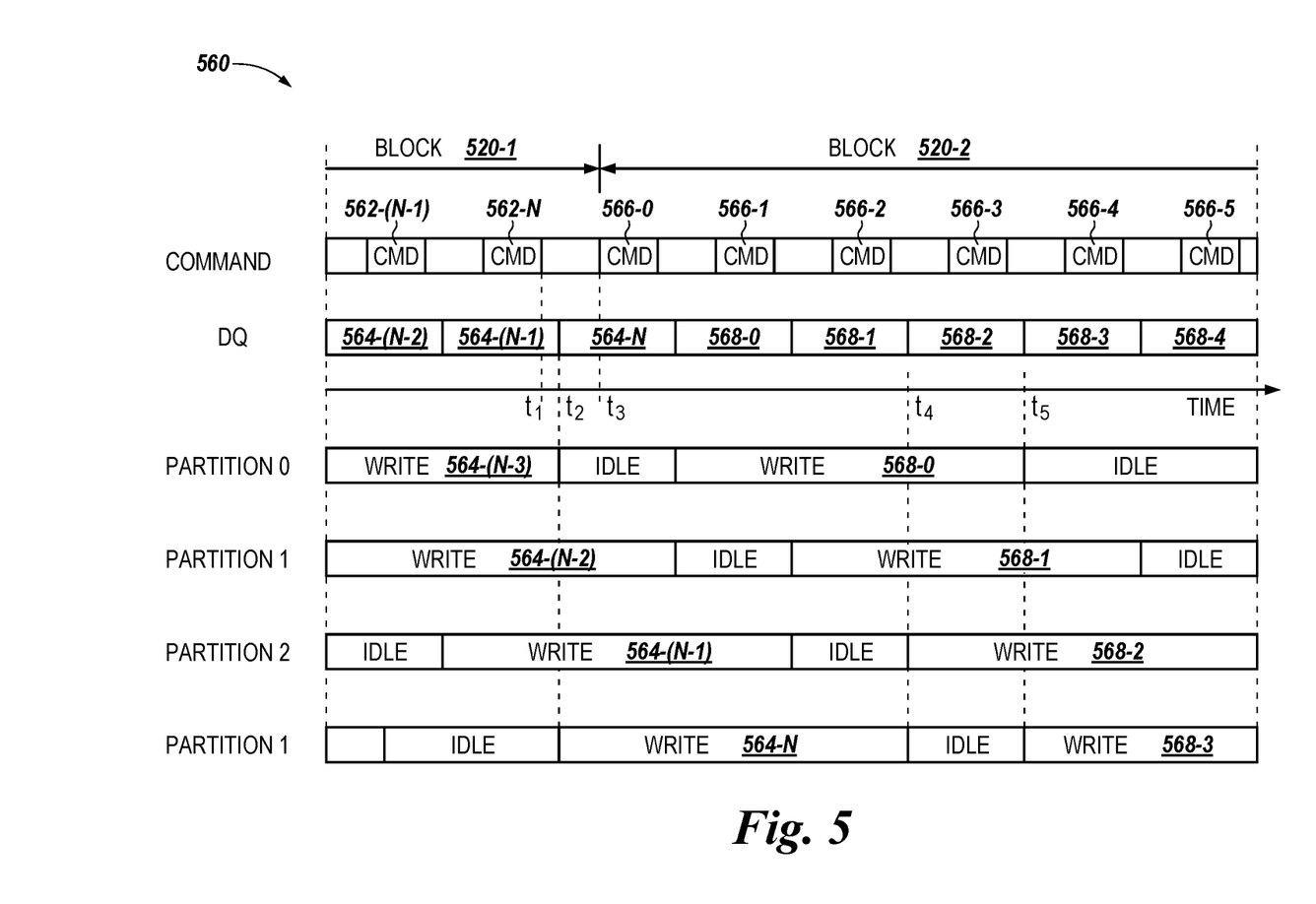
FIG. 5 illustrates a diagram associated with performing an example counter update operation during a write operation in accordance with a number of embodiments of the present disclosure.

FIG. 5 illustrates a diagram 560 associated with performing a counter update operation during a write operation in accordance with a number of embodiments of the present disclosure. In this example illustrated in FIG. 5, the write operation may be an operation requested by a host (e.g., host 102) to be performed on blocks 520 (e.g., block 220). For example, a request to perform the write operation may be received at a system controller (e.g., system controller 110), which generates corresponding commands (e.g., by the datapath component 114) and sends the corresponding commands to a control logic (e.g., control logic 118).

As illustrated in FIG. 5, two different blocks 520-1 and 520-2 (e.g., collectively referred to as blocks 520) are shown in FIG. 5. Each of the blocks may be a managed unit and partitioned into a number of address spaces such that each of the number of address spaces may be controlled independently of others. For example, each partitioned address space of the blocks may include a portion of a number of pages (e.g., of each of the blocks) such that a number of operations may be simultaneously performed among pages of the same block. For example, the control logic 118 may initiate a write operation (e.g., along with a counter update operation) corresponding to a command 562-N while a write operation corresponding to a command 562-(N−1) is being performed. As an example, pages 564-(N−3), 564-(N−2), 564-(N−1), and 564-N (e.g., of the block 420-1) may be assigned to a partition 0, 1, 2, and 3, respectively, and pages 568-0, 568-1, 568-2, and 568-3 may be assigned to a partition 0, 1, 2, and 3, respectively.

The block 520-1 may include a number of pages (e.g., N+1 pages) including a page 562-(N−1) and a page 562-N. For example, the page 562-(N−1) (e.g., one of a plurality of first groups of memory cells) may comprise user data, which can be written (e.g., retrieved to a host 102) via a write command 562-(N−1). For example, the page 562-N (e.g., a second group of memory cells) may comprise overhead data and counters associated with the block 520-1, which can be written via a write command 562-N. Accordingly, a counter update operation may be performed on the page 562-N.

In this example illustrated in FIG. 5, write commands 562 including commands 562-(N−1) and 562-N may be sequentially received from a time $t_3$. Accordingly, write operations on the pages 564 including pages 564-(N−1) and 564-N may be sequentially initiated prior to a time $t_3$ in response to the receipt of the write commands 562.

The command 562-(N−1) directed to a page 564-(N−1) is received (e.g., at the control logic 118) at some time prior to a time $t_1$ as well as prior to a command 562-N. For example, the command 562-(N−1) may include an instruction to write a data pattern (e.g., user data received from the host 102) as well as the data pattern to be stored on the page 562-(N−1). As such, the control logic 118 can perform a write operation on the page 564-(N−1) by storing a data pattern received from the system controller 110 (e.g., as from the host 102) on the page 564-(N−1).

The command 562-N directed to a page 564-N is received (e.g., at the control logic 118) at a time $t_1$. For example, the command 562-N may include an instruction to write a data pattern (e.g., overhead data received form the host 102) as well as the data pattern to be stored on the page 562-N. In response to a receipt of the data pattern a time $t_2$, the control logic 118 can, from a time $t_2$ to a time $t_4$, update the counters stored on the page 562-N in addition to (e.g., as well as) writing the received data pattern to the page 562-N.

As such, the control logic 118 can update the counters and write the data by an individual write operation (e.g., by the write operation performed from a time $t_2$ to a time $t_4$). Accordingly, a separate operation such as a counter update operation may not be required for updating the counters during a write operation. Stated differently, a counter update operation can be embedded within a write operation performed on the page 564-N.

In this example illustrated in FIG. 5, write commands 566 including commands 566-0, . . . , 566-5 may be sequentially received from a time $t_3$, and write operations on the pages 568 including pages 568-0, . . . , 568-3 may be sequentially initiated from a time $t_3$ in response to the receipt of the write commands 566. While the write operation is being performed on the page 564-N, another operation (e.g., write operations) may be initiated on another block 520-2. For example, data patterns (e.g., requested to be written to the block 520-2) may be written to those pages 568-0 and 568-1 that are assigned to a different partition (e.g., partition 0 and partition 1) than the page 564-N (e.g., partition 3) while the write operation is being performed on the page 564-N. Data patterns may be initiated to be written to pages 568-2 (e.g., at a time $t_4$) and 568-3 (e.g., at a time $t_5$) in response to a receipt of write commands 566-2 and 566-3, respectively.

In some embodiments, write operations can include operations that can be referred to as read-modify-write (RMW) operations. For example, writing a data pattern to pages can include reading an entire page of data from an array of memory cells, updating the page with new data pattern, and then writing the updated page back to the array of memory cells. As such, a read operation that can be performed as a part of the RMW operation is an inherent operation of the RMW operation such that the read operation and a write operation of the same read-modify-write operation are performed by an individual operation. Accordingly, those write operations illustrated in FIG. 5 may not need a read operation separate from the write operations if the write operations are RMW operations. In some embodiments, updating the counters can include applying a write signal only to those cells of pages whose states are to be changed during a write operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells comprising a first group of memory cells and a second group of memory cells, wherein the first group is one of a plurality of groups of a managed unit and respective counters associated with the managed unit are stored on the first group; and
a memory controller coupled to the array and configured to:
perform, responsive to receipt of a plurality of commands, corresponding memory operations sequentially on the first group of memory cells and the second group of memory cells; and
perform, independently of the plurality of commands, a counter update operation on the first group of memory cells such that the respective counters stored on the first group are updated while a respective one of the corresponding memory operations is being performed on the second group of memory cells.

2. The apparatus of claim 1, wherein the plurality of commands received are free of instructions to cause the memory controller to update the respective counters stored on the first group.

3. The apparatus of claim 1, wherein the counter update operation is embedded within a respective one of the corresponding memory operations performed on the first group of memory cells.

4. The apparatus of claim 1, wherein the memory controller is configured to increment values of the respective counters until a threshold value is reached.

5. The apparatus of claim 1, wherein the memory controller is configured to reset values of the respective counters to an initial value in response to a determination that values of the respective counters have reached a threshold value.

6. The apparatus of claim 1, wherein the array of memory cells comprises non-volatile memory cells.

7. The system of claim 1, wherein the respective counters comprise at least one of:
  a read counter whose value is incremented each time the group is read; or
  a write counter whose value is incremented each time the group is programmed.

8. The system of claim 7, wherein the read counter and the write counter have different threshold values.

9. A system, comprising:
  a memory device comprising a group of memory cells; and
  a system controller coupled to the memory device, wherein the system controller is configured to issue a command to read data from the group of memory cells comprising a counter associated with the group of memory cells;
  wherein the memory device is configured to:
    in response to receipt of the command from the system controller, transfer the data from the group to the system controller; and
    update the counter independently of the command received from the system controller such that the counter is updated simultaneously while the data are being transferred to the system controller.

10. The system of claim 9, wherein the memory device is configured to alert the system controller when a value of the counter has reached a threshold value.

11. The system of claim 9, wherein the memory device is configured to decrement a value of the counter in response to the group of memory cells being refreshed.

12. The system of claim 9, wherein the group of memory cells further comprises metadata.

13. The system of claim 9, wherein the system controller is coupled to the memory controller via a memory interface compliant with Double Data Rate (DDR), Open Nand Flash Interface (ONFI), or any combination thereof.

14. The system of claim 9, wherein the group of memory cells corresponds to one of a plurality of pages of NAND memory cells.

15. The system of claim 9, wherein the system controller comprises a Non-Volatile Memory Express (NVMe) controller.

16. A method, comprising:
  receiving a plurality of commands directed to a managed unit comprising a first group of memory cells and a second group of memory cells, wherein respective counters associated with the managed unit are stored on the second group of memory cells; and
  performing, independently of the plurality of commands, a counter update operation on the second group while a memory operation corresponding to one of the plurality of commands is being performed on the first group.

17. The method of claim 16, further comprising performing, responsive to receiving the plurality of commands, memory operations corresponding to the plurality of commands sequentially on the first group and the second group.

18. The method of claim 16, wherein performing the counter update operation on the second group while the memory operation corresponding to one of the plurality of commands is being performed on the first group comprises updating a write counter on the second group while the memory operation corresponding to a write operation is being performed on the first group.

19. The method of claim 16, wherein:
  the memory operation performed on the first group comprises a read-modify-write (RMW) operation; and
  the method further comprises applying a write signal only to those cells of the first group whose states are to be changed during the RMW operation.

20. The method of claim 19, wherein performing the counter update operation on the second group further comprises applying a write signal only to those cells of the second group whose states are to be changed during the RMW operation.

* * * * *